(12) United States Patent
Kanayama et al.

(10) Patent No.: US 6,967,391 B2
(45) Date of Patent: Nov. 22, 2005

(54) ELECTRONIC CONTROL DEVICE

(75) Inventors: Mitsuhiro Kanayama, Anjo (JP);
Takanori Ishikawa, Chita-gun (JP);
Toru Itabashi, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/689,099

(22) Filed: Oct. 21, 2003

(65) Prior Publication Data

US 2004/0169294 A1   Sep. 2, 2004

(30) Foreign Application Priority Data

Oct. 21, 2002   (JP) .............................. 2002-305632

(51) Int. Cl.[7] ...................... H01L 23/552; H01L 23/34; H01L 23/58
(52) U.S. Cl. ...................... 257/659; 257/660; 257/723; 257/913; 365/226
(58) Field of Search ................ 257/913, 659, 257/660, 723; 365/226

(56) References Cited

U.S. PATENT DOCUMENTS

| | | | | |
|---|---|---|---|---|
| 4,885,628 A | * | 12/1989 | Nagai et al. ................. | 257/500 |
| 4,899,314 A | * | 2/1990 | Miyamoto et al. .......... | 365/226 |
| 5,047,986 A | * | 9/1991 | Miyamoto et al. .......... | 365/226 |
| 5,483,110 A | * | 1/1996 | Koide et al. ................. | 307/147 |
| 5,616,952 A | * | 4/1997 | Nakano et al. ............. | 257/659 |
| 6,191,475 B1 | * | 2/2001 | Skinner et al. ............. | 257/700 |
| 6,285,573 B1 | * | 9/2001 | Park ............................ | 365/53 |
| 6,396,150 B2 | * | 5/2002 | Kohno ........................ | 257/758 |
| 6,396,329 B1 | * | 5/2002 | Zerbe ......................... | 327/336 |
| 6,657,285 B1 | * | 12/2003 | Cheng et al. ............... | 257/659 |
| 6,720,804 B2 | * | 4/2004 | Taguchi et al. ............. | 327/108 |

FOREIGN PATENT DOCUMENTS

| | | |
|---|---|---|
| JP | A-H05-29531 | 2/1993 |
| JP | A-H09-37545 | 2/1997 |
| JP | A-H09-215324 | 8/1997 |

* cited by examiner

*Primary Examiner*—Long Pham
*Assistant Examiner*—Shrinivas H. Rao
(74) *Attorney, Agent, or Firm*—Posz Law Group, PLC

(57) ABSTRACT

An electronic control device includes a power supply circuit, electronic circuits, a ground wiring pattern, and a common ground wiring pattern formed in a multi-layered substrate. The ground wiring pattern is dedicated for the power supply circuit and the common ground wiring pattern is provided for all electronic circuits. Even when an electrical potential of the ground wiring pattern varies due to a switching operation of a switching component included in the power supply circuit, the common ground wiring pattern is not affected.

12 Claims, 4 Drawing Sheets

ELECTRONIC CONTROL DEVICE

CROSS REFERENCE TO RELATED APPLICATION

This application is based on and incorporates herein by reference Japanese Patent Application No. 2002-305632 filed on Oct. 21, 2002.

FIELD OF THE INVENTION

The present invention relates to an electronic control device having a power supply circuit for adjusting an externally applied power supply voltage.

BACKGROUND OF THE INVENTION

A power supply circuit that outputs a voltage adjusted at a desired level by switching regulation has been introduced as a power supply circuit for an electronic control device. An example of such a power supply circuit is proposed in JP-A-9-37545 and shown in FIG. 8. A control circuit 105 is connected to a base of an output transistor 101, to which a voltage is applied at its input terminal.

The control circuit 105 produces square-wave duty signals Sd shown in FIG. 9 for switching the output transistor 105, and adjusts a duty ratio in the switching according to a desired output voltage level. An output terminal of the output transistor 101 is connected to a smoothing circuit constructed of a capacitor 102 and a choke coil 107. A diode 106 is connected in parallel with the smoothing circuit.

When the output transistor 101 is turned on by the control circuit 105, a current flows as indicated with an arrow A' in FIG. 8. As a result, the choke coil 107 is excited and the capacitor 102 is charged. When the output transistor 101 is turned off, energy stored in the choke coil 107 produces a current flow as indicated with an arrow B' in FIG. 8. In other word, the current flows in a closed circuit containing a freewheel diode 106, the choke coil 107, and the capacitor 102.

The capacitor 102 supplies power supply voltages to loads regardless of the on/off condition of the output transistor 101. Because a charging current is higher than a discharging current when the output transistor 101 is turned on, a terminal voltage Vc of the capacitor 102 increases. The terminal voltage Vc of the capacitor 102 decreases when the output transistor 101 is turned off. The relationship between the terminal voltage Vc and the on/off condition of the output transistor 101 is shown in FIG. 9.

The control circuit 105 monitors the terminal voltage Vc and adjusts the duty ratio of the output transistor 101 so that the terminal voltage Vc remains within a predetermined range. With these operations, a direct-current voltage can be outputted from the power supply circuit at a desired voltage level.

In recent years, electronic control devices for electronically controlling vehicles or home appliances become sophisticated and scales of circuits included in the devices have been increasing. To decrease the size of a substrate, multi-layered substrate is becoming pervasive as a substrate for electronic control devices.

The substrate has an inner layer with common ground wiring pattern for different electronic circuit. Ground terminals of the electronic circuit are connected to the common pattern. When ground terminals of the smoothing circuit and the diode 106 shown in FIG. 8 are connected to the common pattern, a large current repeatedly flows as indicated with the arrow A' or B' according to the switching operation.

When the large current flows from the ground terminal of the smoothing circuit and the diode 106, voltages at the connecting points vary due to impedance of the common pattern. If an analog-to-digital (A/D) converter using a ground potential of the common pattern are connected to the ground pattern, high precision analog-to-digital conversion cannot be performed.

SUMMARY OF THE INVENTION

The present invention therefore has an objective to provide an electronic control device in which voltages at the common ground wiring pattern do not vary even when a multi-layered substrate is used. An electronic control device of the present invention includes a power supply circuit for adjusting an externally applied power supply voltage to a desired level. The power supply circuit is formed on a multi-layered substrate.

The power supply circuit includes a switching component and an output voltage forming circuit. The power supply voltage is applied to an input terminal of the switching component that is driven by a duty signal. The output voltage forming circuit produces an output voltage formed from a voltage inputted from the switching device.

The power supply circuit further includes a ground wiring pattern, a common ground wiring pattern, and a connecting part. The ground wiring pattern dedicated for the output forming circuit is connected to the output voltage forming circuit and defines a ground electrical potential of the output voltage forming circuit. The common ground wiring pattern provided for all electronic circuits included in the electronic control device is formed in a multi-layered substrate and defines a ground electrical potential of each electronic circuit. The connecting part is provided for connecting the ground wiring pattern with the common ground wiring pattern.

When the switching component is driven by the duty signal and a large current is fed from the output voltage forming circuit to the ground wiring pattern, the common ground wiring pattern is not affected. Therefore, even if a circuit that operates with reference to a ground potential of the common ground wiring pattern is connected to the pattern, the circuit operates with high accuracy.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENT

Figure 1:
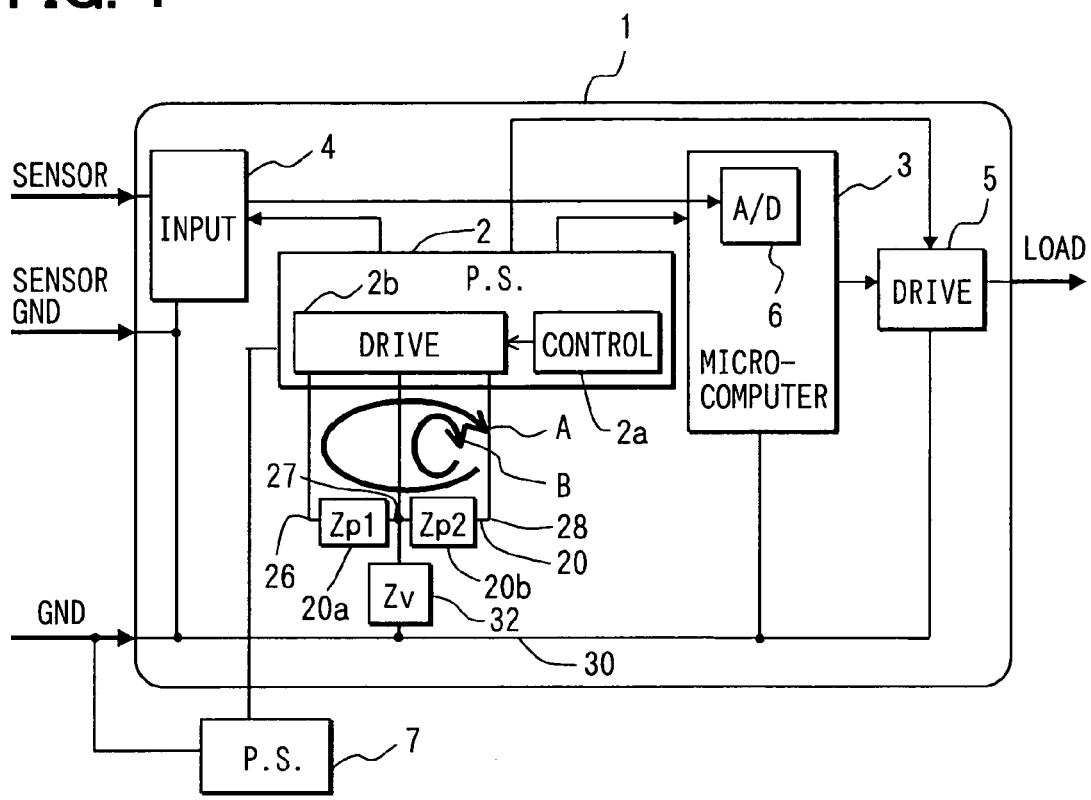
FIG. 1 a block diagram of an electronic control device according to the first embodiment of the present invention.

The preferred embodiments of the present invention will be explained with reference to the accompanying drawings. In the drawings, the same numerals are used for the same components and circuits.

[First Embodiment]

Referring to FIG. 1, an electronic control device 1 includes a power supply circuit 2, a microcomputer (MC) 3, an input circuit 4, and a drive circuit 5. The electronic control device 1 adjusts an externally applied power supply voltage to a desired level. The power supply circuit 2 supplies the adjusted voltage to internal circuits, including the MC 3, the input circuit 4, and the drive circuit 5.

The input circuit 4 performs filtering on signals inputted from various sensors. The signals processed by the input circuit 4 are converted from analog to digital by an analog-to-digital (A/D) converter included in the MC 3. The MC 3 performs operations based on the digital signals and determines control values for driving various electronic loads according to the results of the operations. Control signals indicative of the control values are inputted to the drive circuit 5 and the electronic loads are driven by the driving circuit 5.

Figure 2:
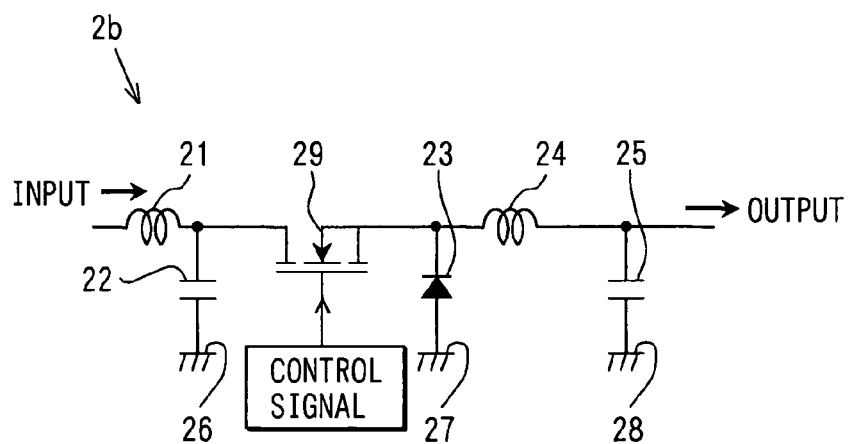
FIG. 2 is a circuit diagram of a driving section of a power supply circuit included in the electronic control device according to the first embodiment.

The power supply circuit 2 has a control section 2a and a drive section 2b. Referring to FIG. 2, the control section 2a outputs a duty signal to a gate of the switching component (N channel power MOSFET) 29 in the drive section 2b for driving the MOSFET 29 by the duty signal. More specifically, the control section 2a produces a square-wave signal (duty signal) and adjusts a duty ratio of the square-wave signal based on a desired voltage.

The driving section 2b has an input-side smoothing circuit connected to an input terminal of the power supply circuit 2. The input-side smoothing circuit is constructed of a choke coil 21 and a capacitor 22. It smoothes out the power supply voltage supplied by an external power supply 7. The smoothed power supply voltage charges the capacitor 22. With this operation a constant voltage is supplied from the capacitor 22 to the MOSFET 29 even when the power supply voltage is momentarily varied. Furthermore, the other terminal of the capacitor 22 is connected to a ground wiring pattern 20 at a grounding point 26.

A terminal voltage of the capacitor 22 is applied to a drain of the MOSFET 29. A source of the MOSFET 29, which is an output terminal, is connected to an output-side smoothing circuit. The output-side smoothing circuit is an output voltage forming circuit constructed of a choke coil 24 and a capacitor 25. A freewheel diode 23 is connected in parallel with the output-side smoothing circuit and make an output voltage forming circuit together with the smoothing circuit. One of the terminals of the capacitor 25 is connected to the ground pattern 20 at a grounding point 28. An anode of the freewheel diode 23 is connected to the ground pattern 20 at a grounding point 27.

With the above configuration, the power supply circuit 2 outputs a desired DC voltage when the MOSFET is driven by the duty signal.

Figure 3:
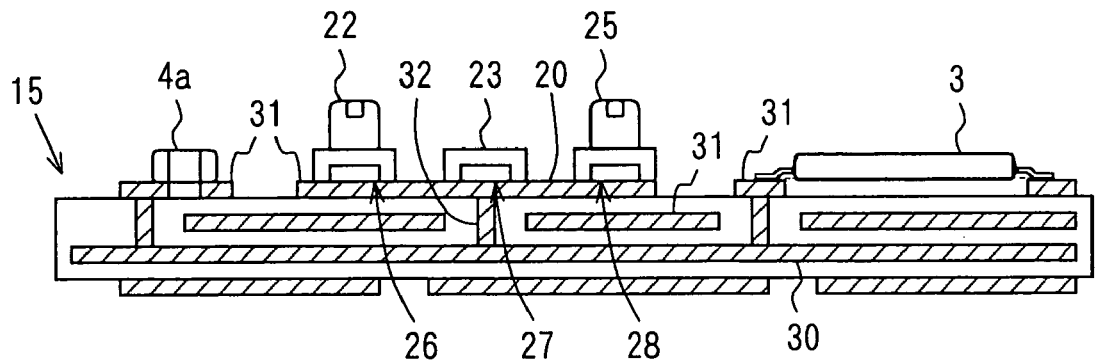
FIG. 3 is a cross-sectional view of a multi-layered substrate included in the electronic control device according to the first embodiment.

Referring to FIG. 3, a multi-layered substrate 15 includes various components and electronic parts mounted on a surface of one of its layers. An electrode of a filter capacitor 4a included in the input circuit 4 is soldered to a land pattern of a wiring pattern 31 formed on a top layer surface of the multi-layered substrate 15. Likewise, an LSI of the MC 3, the capacitors 22, 25, and the freewheel diode 23 are connected to the wiring pattern 31.

The top layer includes a common ground wiring pattern 30 for providing a ground potential to electronic components, parts, and circuits formed in the top layer. Likewise, an inner layer of the multi-layered substrate 15 includes another common ground wiring pattern 30 for providing a ground potential to electronic components, parts and circuits formed in the inner layer. The common ground wiring patterns 30 are connected with an external terminal that provides a ground potential.

Furthermore, a ground wiring pattern 20 dedicated for the drive section 2b is formed in the top layer. In other words, ground terminals of the capacitors 22, 23 and the freewheel diode 23 are connected to the ground wiring pattern 20 at their respective grounding point 26, 27, 28. The ground wiring pattern 20 is connected to the common ground pattern 30 via an interlayer connecting part 32 formed in a via hole.

The multi-layered substrate 15 is constructed of layers of glass epoxy resin for an insulator and copper foil for wiring patterns alternately placed. A ceramic multi-layered substrate may be used for the multi-layered substrate 15. A thermoplastic resin may be used for the insulator.

For connecting the ground patterns 20 and 30 via interlayer connection, a laser-drilled via hole may be used. Inside of the via hole is deposited with copper by plating. The wiring patterns 20 and 30 that are formed in different layers can be electrically connected at a desired point through the via hole. The inside of the via hole can be conductive by filling conductive paste.

Figure 4A:
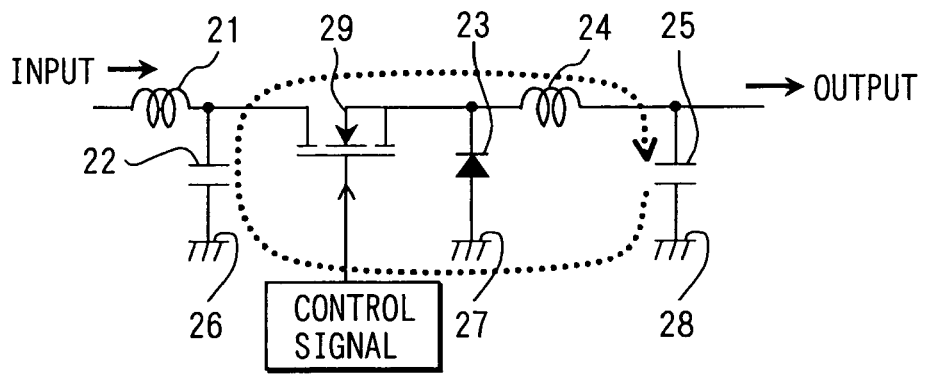
FIG. 4A is an explanatory diagram of the driving section showing a current flow when a switching component is turned on according to the first embodiment.

In the power supply circuit 2, the MOSFET 29 is driven by a duty signal for producing a DC voltage by adjusting the power supply voltage to a desired level. When the MOSFET is turned on by the duty signal, the electrical charge accumulated in the capacitor 22 produces a current flowing to the capacitor 25 via the choke coil 24. The current flows in a closed circuit having the input-side smoothing circuit, the output-side smoothing circuit, and the ground pattern 20 as indicated with a dotted-line arrow in FIG. 4A.

Figure 5:
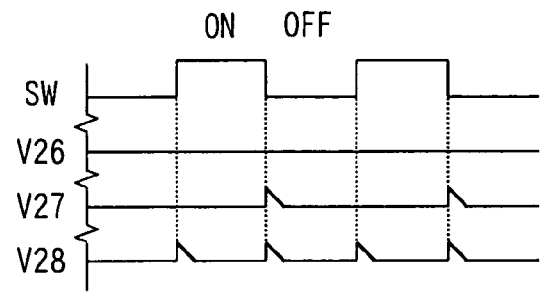
FIG. 5 is a timing chart showing voltage variations at connecting points between a ground wiring pattern and capacitors or a freewheel diode as the switching component is turned on or off according to the first embodiment.

At the moment when the MOSFET turns on, the current starts flowing at a burst produced by the electrical charge accumulated in the capacitor 22. As a result, large currents flow in the input-side smoothing circuit and the output-side smoothing circuit. Furthermore, the current substantially varies in the output-side smoothing circuit. Therefore, the electrical potential of the ground pattern 20 at the grounding point 28 of the capacitor 25 varies at the moment when the MOSFET 29 is turned on as shown in FIG. 5. This is because the ground pattern 20 has impedance including a resistive component. Although not shown in FIG. 5, a large current is also fed by the capacitor 22. Thus, the electrical potential of the ground pattern 20 at the grounding point 26 slightly varies.

Figure 4B:
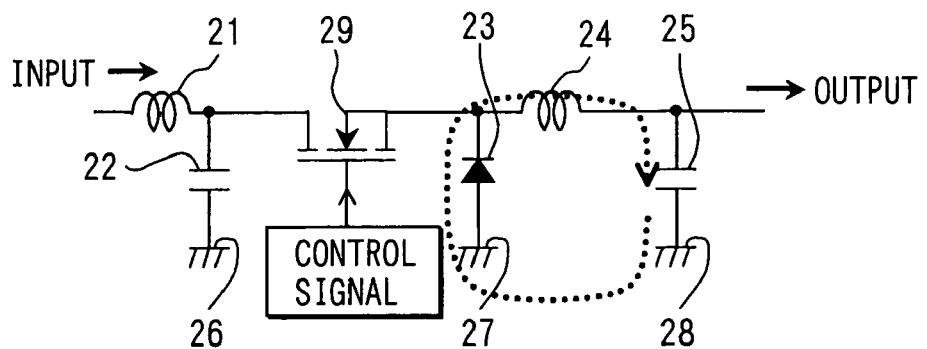
FIG. 4B is an explanatory diagram of the driving section showing a current flow when the switching component is turned off according to the first embodiment.

When the MOSFET is turned off, the electric charge accumulated in the choke coil 24 continues to produce a current that flows in a closed circuit as indicated with a dotted-line arrow in FIG. 4B. The closed circuit includes the freewheel diode 23, the choke coil 24, a capacitor 25, and the ground pattern 20. At the moment when the current is produced by the electrical charge in the choke coil 24, a large current flows. Therefore, the electrical potentials of the ground pattern 20 at the grounding points 27 and 28 vary.

If an electrical potential of the common ground pattern 30 varies, the operating accuracy of the A/D converter 6 decreases because it operates with reference to the ground potential of the ground pattern 30. Therefore, the electronic control device 1 is provided with the ground pattern 20 dedicated for the driving section 2b in addition to the common ground pattern 30. This reduces an effect of the potential variation at the grounding points 26, 27, 28 to the common ground pattern 30.

The circuit is designed so that impedance Zp1, Zp2 produced by the ground pattern 20 located between the grounding points 26, 27, 28 is smaller than impedance Zv of the interlayer connecting part 32. Since the ground pattern 20 defines the ground potential, it is formed in a relatively large area. The interlayer connecting part 32 provided for connecting the ground pattern 20 and the common ground pattern 30 is made of a conductive material formed in the via hole with a small diameter. Therefore, the interlayer connecting part 32 has higher impedance than the ground pattern 20. Even when the potential variation occurs in the ground pattern 20, most of the current flows to the closed circuit as indicated with the solid-line arrow A or B in FIG. 1. This reduces an effect of the potential variation to the common ground pattern 30.

The ground pattern 20 dedicated for the driving section 2b is formed on the top surface of the multi-layered substrate 15. Thus, the wiring the capacitors 22, 25 and the freewheel diode 23 for connection to the ground pattern 20 remains short, and an increase in impedance due to the wiring can be reduced. This increases the current flow from the driving section 2b to the ground pattern 20 when the MOSFET is driven by the duty signal.

[Modifications of the First Embodiment]

Figure 6:
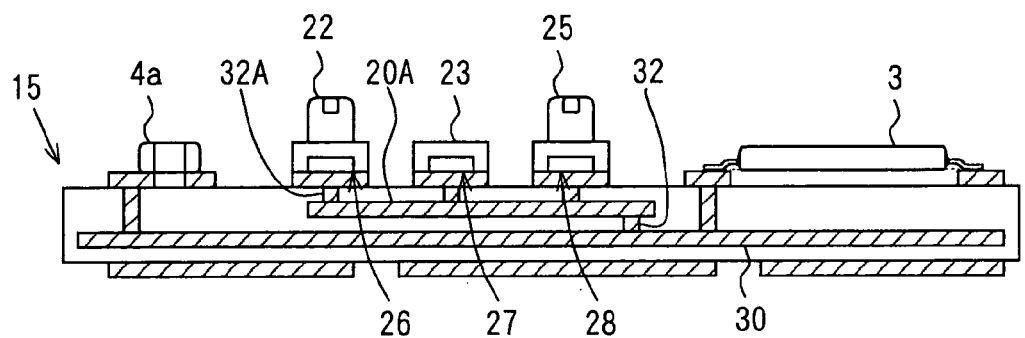
FIG. 6 is a cross-sectional view of an electronic control device according to a modification of the first embodiment.

Referring to FIG. 6, a ground wiring pattern 20A dedicated for the driving section 2b is formed in the inner layer of the multi-layered substrate 15. The ground terminals of the capacitors 22, 25, and the freewheel diode 23 are connected to a land pattern formed in the top layer. The land pattern is connected to the ground pattern 20A via an interlayer connecting part 32A. The ground pattern 20A dedicated for the driving section 2b and the common ground pattern 30 are separately provided. Thus, substantially the same effect as the first embodiment can be produced.

Figure 7:
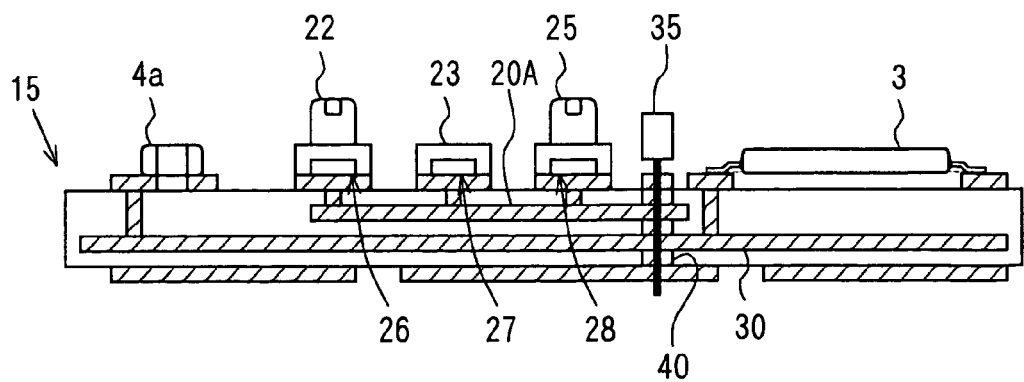
FIG. 7 is a cross-sectional view of an electronic control device according to another modification of the first embodiment.
Figure 8:
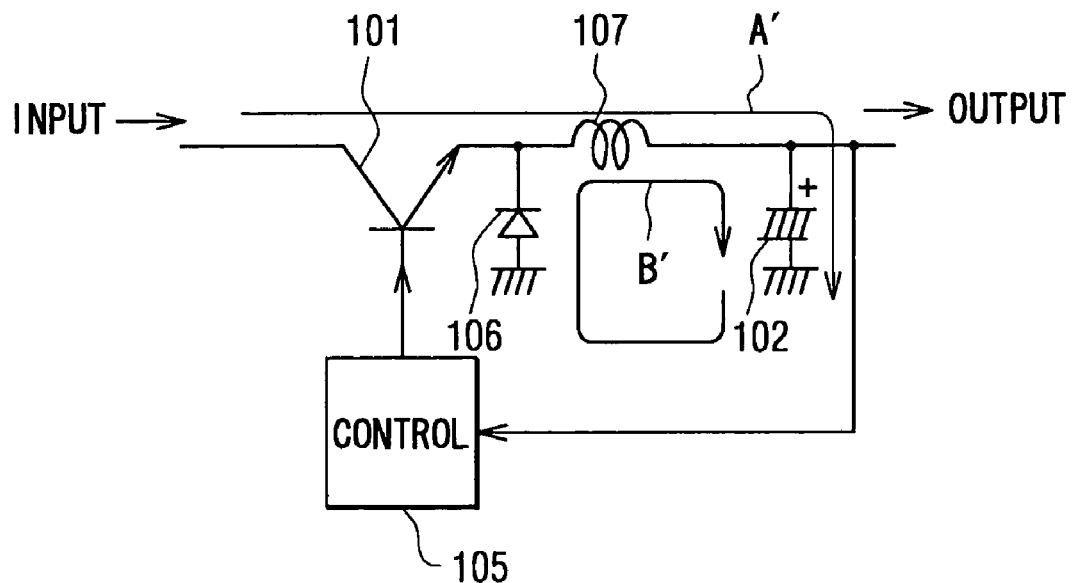
FIG. 8 is a circuit diagram of a power supply circuit according to a prior art.
Figure 9:
FIG. 9 is a graph showing output voltage of the power supply circuit according to the prior art shown in FIG. 8.

It is favorable that the ground pattern 20A is formed as close to the layer in which the power supply circuit 2 is formed as possible to reduce the impedance between the driving section 2b and the ground pattern 20A. A ground terminal of an electronic component 35, which is unaffected by the variation in the ground potential, is connected to both ground pattern 20A and common ground pattern 30 via a through hole 40 as shown in FIG. 7. An conductive material is provided in the through hole 40. As a result, the ground pattern 20A and the common ground pattern 30 are electrically connected to each other via the ground terminal of the component 35.

The present invention should not be limited to the embodiment previously discussed and shown in the figures, but may be implemented in various ways without departing from the spirit of the invention. For example, the input-side smoothing circuit may not be necessary if a wiring distance between the power supply and the electronic control device is short or a device susceptible to noise such as a radio is not arranged in the input path.

The power supply circuit may be configured as a step-up type power supply circuit or a reverse type power supply circuit as long as a switching operation is performed by a switching component. A MOSFET or other components that function as a freewheel component can be used.

What is claimed is:

1. An electronic control device having a power supply circuit formed on a multi-layered substrate for adjusting a power supply voltage supplied by an external power supply to a desired level, the power supply circuit including a switching component to which the power supply voltage is applied at an input terminal thereof and which is driven by a duty signal comprising:

an output voltage forming circuit formed in a top layer of the multi-layered substrate for producing an output voltage formed from a voltage inputted from the switching device;

a ground wiring pattern that defines a ground electrical potential of the output voltage forming circuit;

a common ground wiring pattern that defines a ground electrical potential of each of electronic circuits included in the electronic control device, except for the output voltage forming circuit; and a connecting part that connects the ground wiring pattern with the common ground wiring pattern, wherein the ground wiring pattern is formed in a layer of the multi-layered substrate and connected to the output voltage forming circuit, and the common ground wiring pattern is formed in a layer of the multi-layered substrate.

2. The electronic control device according to claim 1, wherein:

the output voltage forming circuit includes a smoothing circuit constructed of a choke coil and a capacitor, and a freewheel component connected in parallel with the smoothing circuit for feeding a current back to the choke coil when the switching component is turned of;, and the smoothing circuit and the freewheel component are connected to the ground wiring pattern.

3. The electronic control device according to claim 2, wherein the impedance of the ground wiring pattern between the smoothing circuit and the freewheel component is lower than that of the connecting part.

4. The electronic control device according to claim 1, wherein:

the output voltage forming circuit further includes an input-side smoothing circuit constructed of a choke coil and a capacitor and a terminal of which is connected to an input terminal of the switching component;

the power supply voltage is applied to the input terminal of the switching component after smoothed out by the input-side smoothing circuit; and the ground wiring pattern is connected to another terminal of the input-side smoothing circuit.

5. The electronic control device according to claim 1, wherein:

the ground wiring pattern is formed in a top layer of the multi-layered substrate; and the connecting part is configured as an interlayer connecting part for connecting the ground wiring pattern formed in the top layer of the multi-layered substrate and the common ground wiring pattern formed in an inner layer of the multi-layered substrate via interlayer connection.

6. The electronic control device according to claim 1, wherein:
  the ground wiring pattern is formed in an inner layer of the multi-layered substrate different from the inner layer in which the common ground wiring pattern is formed; and
  the connecting part is configured as an interlayer connecting part for connecting the ground wiring pattern with the common ground wiring pattern via interlayer connection.

7. The electronic control device according to claim 1, wherein the connecting part has a via hole through which the ground wiring pattern is connected with the common ground wiring pattern.

8. The electronic control device according to claim 1, wherein the connecting part has a through hole having a conductive material inside through which the ground wiring pattern is connected with the common ground wiring pattern.

9. The electronic control device according to claim 8, wherein the ground wiring pattern is connected with the common ground wiring pattern via a ground terminal of an electronic component inserted in the through hole.

10. The electronic control device according to claim 1, wherein the output voltage forming circuit is formed on the ground wiring pattern in the same layer.

11. The electronic control device according to claim 1, wherein: the ground wiring pattern is formed in a different layer from the layer in which the output voltage forming circuit is formed: and the layer in which the ground wiring pattern is formed is located immediately below the layer in which the output voltage forming circuit is formed.

12. The electronic control device according to claim 1, wherein the ground wiring pattern has smaller impedance than that of the connecting part.

* * * * *